United States Patent [19]

Lakin

[11] Patent Number: 5,630,949

[45] Date of Patent: May 20, 1997

[54] METHOD AND APPARATUS FOR FABRICATING A PIEZOELECTRIC RESONATOR TO A RESONANT FREQUENCY

[75] Inventor: Kenneth M. Lakin, Redmond, Oreg.

[73] Assignee: TFR Technologies, Inc., Bend, Oreg.

[21] Appl. No.: 458,025

[22] Filed: Jun. 1, 1995

[51] Int. Cl.$^6$ .................. H01L 21/3065; C23F 1/02; C23C 14/54

[52] U.S. Cl. .................. 216/61; 216/60; 216/59; 216/67; 156/345; 204/192.13; 204/192.18; 204/192.32; 204/192.33; 204/298.03; 204/298.31; 204/298.32; 204/298.34; 204/298.08; 427/100; 29/25.35

[58] Field of Search .................. 204/192.13, 192.15, 204/192.18, 192.32, 192.33, 192.35, 298.03, 298.07, 298.08, 298.31, 298.32, 298.34; 156/345, 643.1, 626.1, 627.1; 216/67, 59, 60, 61; 427/100; 118/723 E; 29/25.35

[56] References Cited

U.S. PATENT DOCUMENTS

| | | | |
|---|---|---|---|
| 2,505,370 | 4/1950 | Sykes | 204/298.26 |
| 3,414,832 | 12/1968 | Newell | 330/286 |
| 3,486,046 | 12/1969 | Zalar | 310/324 |
| 3,568,108 | 3/1971 | Poirier et al. | 333/187 |
| 3,590,287 | 6/1971 | Berlincourt et al. | 310/321 |
| 3,694,677 | 9/1972 | Guttwein et al. | 310/369 |
| 3,704,219 | 11/1972 | McDowell | 204/192.13 |
| 4,092,588 | 5/1978 | Desormiere et al. | 324/727 |
| 4,166,783 | 9/1979 | Turner | 204/298.03 |
| 4,166,967 | 9/1979 | Benes et al. | 310/338 |
| 4,263,088 | 4/1981 | Gorin | 156/626.1 |
| 4,278,492 | 7/1981 | Cross et al. | 216/59 |
| 4,281,484 | 8/1981 | Massa | 451/2 |
| 4,320,365 | 3/1982 | Black et al. | 333/187 |
| 4,353,027 | 10/1982 | Ballato et al. | 324/727 |
| 4,395,849 | 8/1983 | Kasai et al. | 451/2 |
| 4,642,508 | 2/1987 | Suzki et al. | 310/321 |

OTHER PUBLICATIONS

Pitt et al. "Piezoelectric ZnO Transducers Produced by R.F. Magnetron Sputtering" Thin Solid Films, 80 (1981) pp. 183–195 Jul. 1981.

Roberts et al. "A thin film CdS–Quartz Composite Resonator" Journal of Applied Physics vol. 38, No. 5 pp. 2350–2358 Apr. 1967.

Acoustic–Bulk–Wave Resonators and Filters Operating in the Fundamental Mode at Frequencies Greater Than 100 MHz, Electronics Letters, vol. 13, No. 9, Apr. 28, 1977.

DC Plasma Anodization of Quartz Resonators, C.W. Shanley and L.N. Dworsky, 36th Annual Frequency Control Symposium, 1982.

Reactive Ion Beam Etching for VHF Crystal Resonators, J.S. Wang, S.K. Watson, and K.F. Lau, 38th Annual Frequency Control Symposium, 1984.

The Fabrication of High Frequency Fundamental Crystals by Plasma Etching, F.M. Stern, J. Dowsett, D.J. Carter, and R.J. Williamson, 43rd Annual Symposium on Frequency Control, 1989.

(List continued on next page.)

*Primary Examiner*—Robert Kunemund
*Assistant Examiner*—Rodney G. McDonald
*Attorney, Agent, or Firm*—Klarquist Sparkman Campbell Leigh & Whinston

[57] ABSTRACT

Resonator fabricating method and apparatus employ the resonance conditions of the piezoelectric resonator itself to control an RF-powered plasma etching or deposition process. In its basic implementation, the apparatus does not require monitoring of the resonant frequency of the resonator as it is being trimmed. Rather, the resonator provides an impedance which changes as the plasma action changes the thickness of the resonator and thereby changes the resonant frequency of the piezoelectric resonator. The changing impedance in turn changes the rate of plasma action until the action substantially stops with the resonant frequency of the resonator substantially equal to the frequency of the RF source.

22 Claims, 9 Drawing Sheets

OTHER PUBLICATIONS

Bulk Wave Quartz Resonators Fabricated by a Hollow Cathode RF Plasma Etching Technique, Steffen Schreiter and Dimitar Y. Yankov, 45th Annual Symposium on Frequency Control, 1991.

Plasma Etching of Monocrystal Quartz, L. Spassov, E. Yossifov, D. Yankov, H.U. Poll, and S. Schreiter, 44th Annual Symposium on Frequency Control, 1990.

Face–Mounted Piezoelectric Resonators, W.E. Newell, Proceedings of the IEEE, Oct. 26, 1964, revised Jan. 11, 1965.

A Thin–Film CdS–Quartz Composite Resonator, T.R. Sliker and D.A. Roberts, Received Oct. 13, 1966, final form Dec. 9, 1966, Journal of Applied Physics, vol. 38, No. 5, Apr. 1967.

High–Q Microwave Acoustic Resonators and Filters, Kenneth M. Lakin, Gerald R. Kline and Kevin T. McCarron, IEEE Transactions on Microwave Theory and Techniques, vol. 41, No. 12, Dec., 1993.

METHOD AND APPARATUS FOR FABRICATING A PIEZOELECTRIC RESONATOR TO A RESONANT FREQUENCY

FIELD OF THE INVENTION

This invention relates to the manufacture of piezoelectric resonators. More particularly, this invention relates to a method and apparatus for fabricating a piezoelectric resonator to produce a device with a desired resonant frequency.

BACKGROUND OF THE INVENTION

Piezoelectric resonators are often used in frequency control applications that require precise control of the resonant frequency of the resonator. For the common thickness mode resonator, the resonant frequency is a function of the piezoelectric material properties and the thickness of the resonator plate (i.e., the resonant material between the electrodes). The material properties include the elastic stiffness and its density. However, the resonator thickness is the most critical feature in determining the resonator's resonant frequencies during fabrication. The frequency-thickness product 1600 MHz*um, where the thickness is given in microns, approximates the resonant frequency of an AT cut quartz piezoelectric resonator. Other materials have appropriate frequency thickness products.

Resonators are typically manufactured using conventional grinding, lapping, etching and deposition techniques to produce a resonator plate thickness that roughly corresponds to a desired resonant frequency. For many resonator applications, in which the preciseness of the frequency is not critical, this is sufficient. For more demanding applications, the thickness must be adjusted more accurately by a process known as "trimming." In trimming, the resonator's final thickness is controlled by making slight changes in the thickness and then checking the resonant frequency. The resonant frequency may be determined in a number of ways, such as by applying a variable frequency signal to the resonator and determining its impedance. This iterative process continues until the desired resonant frequency is obtained.

Present trimming techniques, however, have a number of drawbacks. Monitoring the resonant frequency requires sophisticated, expensive equipment. Moreover, precisely trimming the resonator in response to the monitored frequency signal is difficult. For example, producing a fundamental mode quartz resonator with a resonant frequency of 400 MHz requires trimming the resonator to a thickness of 4 um. This is extremely thin, and even a slight over-etching or over-depositing in the process would produce a resonator of the wrong thickness and wrong resonant frequency. Moreover, it is not practical to measure a quartz crystal's thickness directly to the degree of accuracy required for determining its desired resonant frequency.

An object of the invention, therefore, is to provide a fabrication technique that trims a resonator to the precise thickness for producing a desired resonant frequency. Another object of the invention is to provide a fabrication technique that requires little or no monitoring of the resonant frequency in the process of trimming the resonator to produce a desired resonant frequency.

SUMMARY OF THE INVENTION

Method and apparatus in accordance with the invention employ the resonance conditions of the piezoelectric resonator itself to control an RF-powered plasma etching or deposition process for fabricating the resonator. In its basic implementation, the invention does not require monitoring of the resonant frequency of the resonator as it is being fabricated. Rather, the resonator provides an impedance which changes as the plasma action changes the thickness of the resonator and thereby changes the resonant frequency of the piezoelectric resonator. The changing impedance in turn changes the rate of plasma action until the action substantially stops with the resonant frequency of the resonator substantially equal to the frequency of the RF source.

An apparatus constructed according to the invention may include a pair of electrodes between which a piezoelectric resonator is placed. Operatively connected to the electrodes to form a circuit is an RF source operating at a selected power level and desired resonant frequency for the piezoelectric resonator. The power level is set so that the plasma action will stop, or extinguish, when the parallel resonant frequency of the resonator equals the RF source frequency. A gas source is provided for injecting gas between the electrodes. The RF source energizes the gas to form a plasma that acts to change the thickness of the piezoelectric resonator. The plasma may act to reduce the resonator thickness if the apparatus is designed for etching, or the plasma may act to increase the resonator thickness by sputtering if the apparatus is designed for depositing material onto the resonator. In either form of the apparatus, the rate of plasma action eventually slows and substantially stops with the resonant frequency of the resonator substantially equal to the frequency of the RF source.

A method according to the invention includes placing a piezoelectric resonator between a pair of electrodes and injecting a gas between the electrodes. The gas may be chemically inert, such as argon, or reactive such as oxygen allowing physical sputtering or reactive sputtering, respectively. Power from an RF source of a selected power level and desired resonant frequency is applied to the electrodes to energize the gas to form a plasma that acts to change the thickness of the piezoelectric resonator until the resonant frequency of the resonator substantially equals the frequency of the RF source. An additional control may be included to adjust the power level of the RF source.

Particular embodiments of apparatus according to the invention may include additional features. If the apparatus is for etching a piezoelectric resonator to reduce its thickness, then the energized gas forms a plasma that etches material from the resonator. If the apparatus is for depositing material on the resonator to increase its thickness, then the energized gas forms a plasma that strikes a target within the apparatus, dislodging target material that is deposited on the resonator surface. The RF source may include a control to adjust the RF frequency so that piezoelectric resonators may be trimmed to different resonant frequencies. The control may be adapted to shift the RF source frequency from an initial frequency to a second frequency as the resonant frequency of the resonator approaches the initial frequency of the RF source. A sensor may be included for sensing the proximity of the plasma to the resonator, with the control responsive to the detector to shift the RF source frequency as the plasma moves away from the resonator. A sensor may be included for sensing current in the circuit, the current changing as the impedance of the circuit changes. The control can use the sensor output to change the RF source frequency or shut off the power. An additional control may be included to adjust the power level of the RF source to limit the plasma action.

Particular embodiments of methods according to the invention may include additional steps. In one method an electrode may be inserted onto the resonator surface between the plasma and the resonator to better control the resonant frequency of a finished resonator. In another method, particular regions of the resonator may be coated with a material to change the resonator's thickness and thereby vary the resonant frequency across the resonator.

The foregoing features and advantages of the invention will become more apparent from the following detailed description of a preferred embodiment which proceeds with reference to the accompanying drawings.

DETAILED DESCRIPTION

Overview

Figure 1:
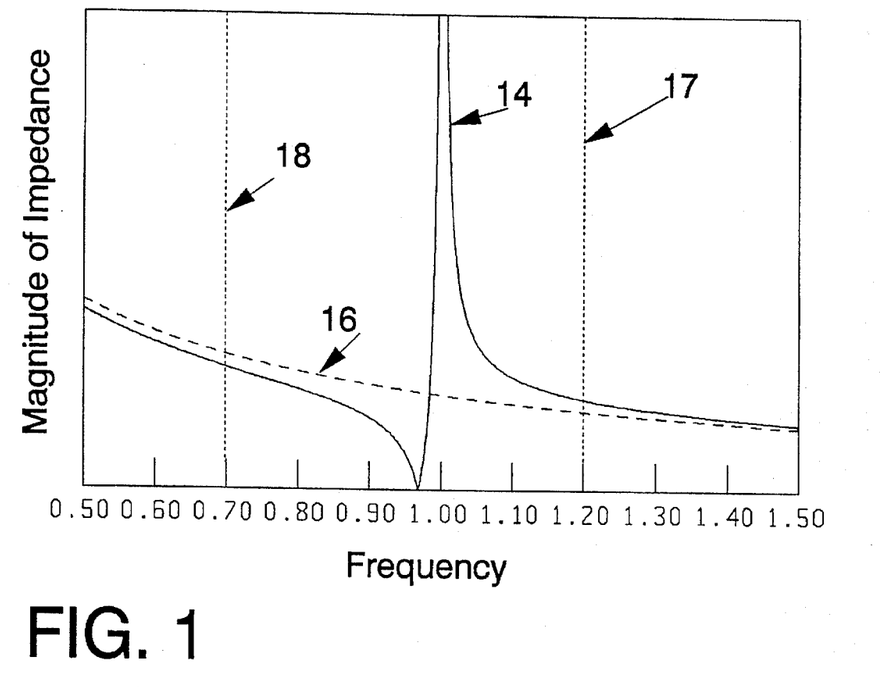
FIG. 1 is a graph of impedance of a piezoelectric resonator as a function of frequency.

The present invention takes advantage of the fact that the impedance of a piezoelectric resonator changes dramatically at its series and parallel resonant frequencies. FIG. 1 is a graph that illustrates with a solid line 14 the impedance characteristics versus frequency of an example piezoelectric resonator, normalized to a reference parallel resonant frequency. Around the parallel resonant frequency (1.00) and its harmonics, the impedance becomes a maximum. Around the series resonant frequency (0.975) and its harmonics, the impedance becomes a minimum. The descending dashed line 16 on the graph represents the impedance characteristics of a normal capacitor. As evident from FIG. 1, piezoelectric resonator has impedance characteristics much like a capacitor except near its series and parallel resonant frequencies and harmonics thereof.

The resonant frequency of a piezoelectric resonator is a function of, among other things, the resonator thickness. As the resonator is reduced in thickness through, for example, an etching process, the resonant frequency increases. Conversely, as the resonator is increased in thickness through, for example, a deposition process, the resonator frequency decreases. Thus in terms of FIG. 1, the solid line shifts to the left if the resonator thickness is increased (indicated by the upper arrow) and shifts to the right if the resonator thickness is decreased (indicated by the lower arrow).

FIG. 1 also includes a vertical dashed line 17 that represents the frequency of an RF power source in an apparatus according to the invention (described below) for use in etching piezoelectric resonators. In an etching process, the RF source-based apparatus causes the resonator to be etched, thereby reducing its thickness. This causes the resonant frequency.(and point of maximum impedance). to shift upward, toward the RF source frequency on the graph. As the resonator thickness continues to decrease, however, the impedance of the resonator in the circuit of the RF source frequency increases. The increasing impedance reduces the etching current in the apparatus and thereby reduces the etching rate. As the parallel resonant frequency of the resonator substantially equals the RF source frequency and at a low enough RF power level, the impedance reduces the etching current of the apparatus to near zero and the etching action substantially stops.

Figure 2:
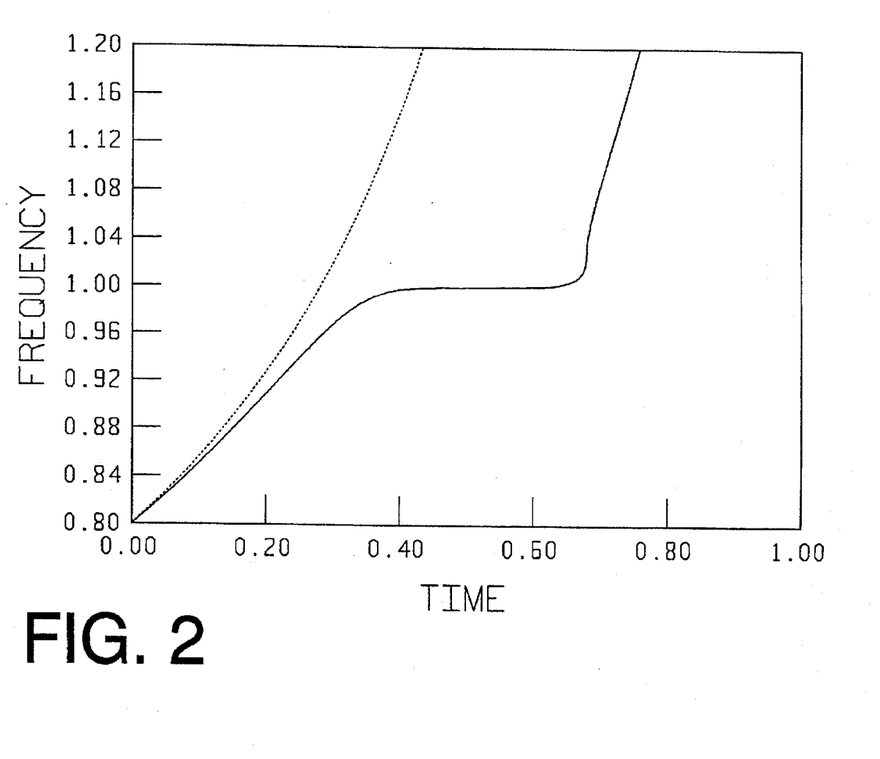
FIG. 2 is a graph of the etching characteristics of a piezoelectric resonator as a function of time.

FIG. 2 is a graph illustrating how the etching rate and the resonant frequency of piezoelectric resonator being etched change over time. In the figure the resonator has an initial parallel resonant frequency that is 0.8 of the RF source. Etching proceeds at a normal rate limited by the normal capacitance of the resonator (dashed line 16) until the parallel resonant frequency of the resonator approaches the RF source frequency (1.00). The drop in etching current at the RF source frequency causes the etch rate to substantially stop. Etching then continues at a reduced rate until the series resonant frequency of the resonator reaches the RF source frequency, where impedance is at a minimum. The etching current then increases, causing the etching rate to increase. However, if the power of the RF source is set sufficiently low, the voltage across the plasma will drop below the plasma sustaining voltage when the resonator reaches its parallel resonant frequency and the plasma will extinguish. This ends the etching process. The hysteresis nature of a plasma requires that the ignition voltage must be larger than the extinguishing voltage. Therefore, once the etching begins the RF power may be adjusted to a sufficiently low value to allow operations to continue, but not so high as to allow re-ignition once the plasma extinguishes.

The RF source may also be used in a similar manner in a deposition process. For this process the RF source frequency is set below the series resonant frequency of the piezoelectric resonator, as indicated by vertical dashed line 18 in FIG. 1. The RF source-based apparatus causes material to be deposited on the resonator, increasing its thickness. The parallel resonant frequency of the resonator decreases. As the resonator thickness continues to increase, eventually, the impedance begins to increase as the parallel resonator frequency approaches the RF source frequency. The increasing impedance reduces the current in the apparatus for deposition and thus reduces the deposition rate. As the resonant frequency of the resonator substantially equals the RF source frequency, the deposition action substantially stops.

Figure 3:
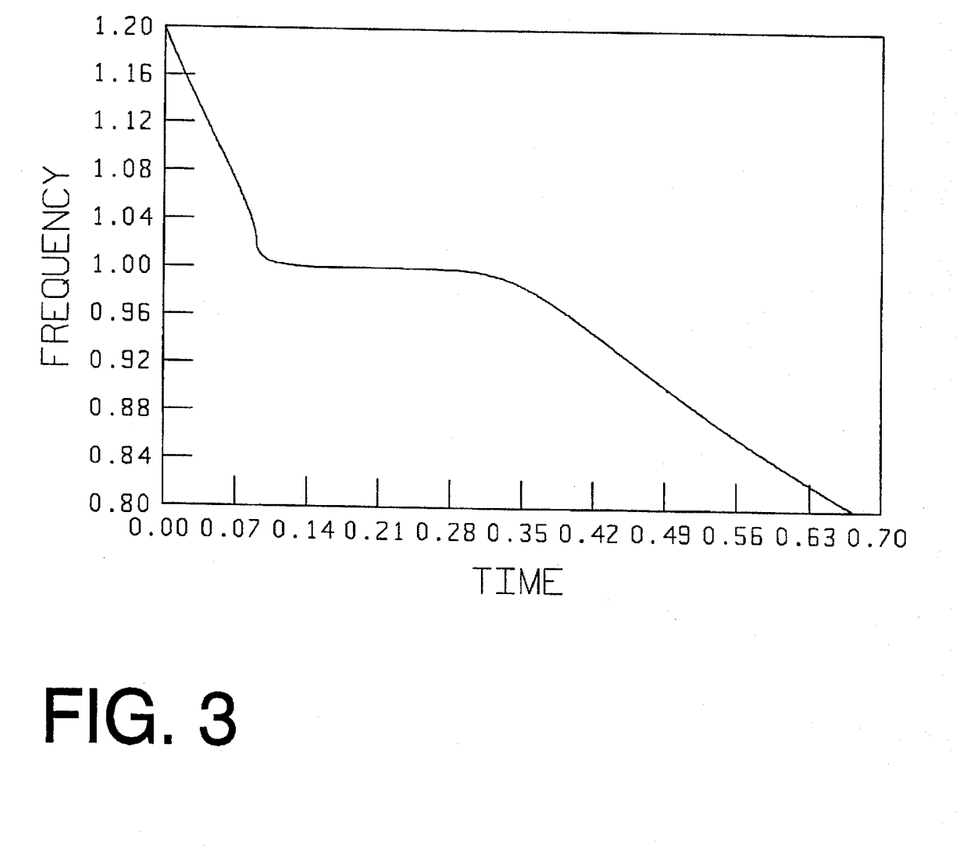
FIG. 3 is a graph of the deposition characteristics of a piezoelectric resonator as a function of time.

FIG. 3 is a graph illustrating how the deposition rate and the resonant frequencies of piezoelectric resonator being trimmed change over time. In the figure the resonator has an initial parallel resonant frequency that is 1.2 times the RF source. Deposition proceeds at a normal rate until the parallel resonant frequency of the resonator approaches the RF source frequency (1.00). The drop in deposition current at this frequency causes the deposition rate to substantially stop. Deposition continues at a reduced rate until the parallel resonant frequency of the resonator passes the RF source frequency and the resonator impedance begins to decline. The deposition current then increases, causing the deposition rate to increase.

The Apparatus

Figure 4:
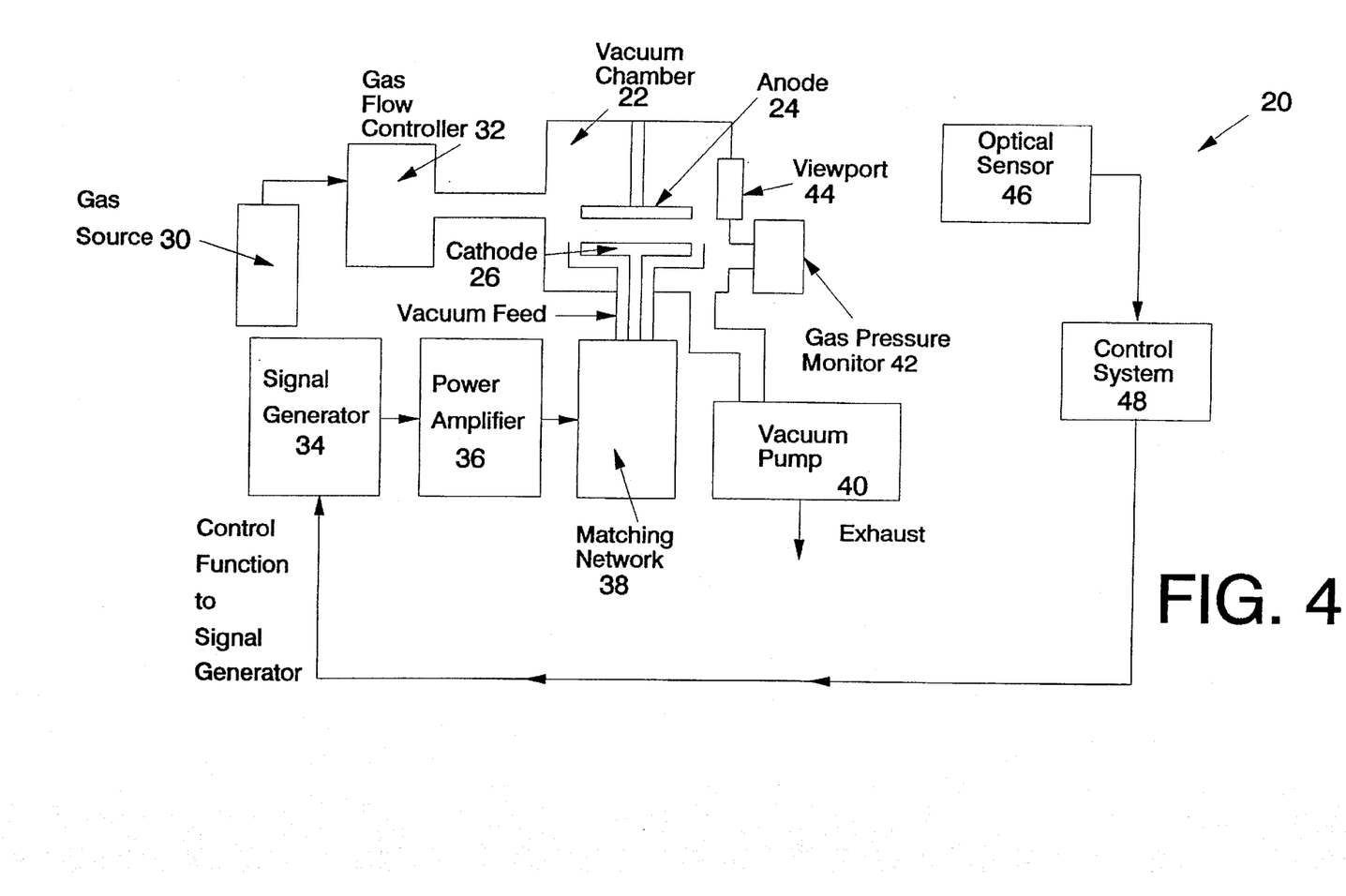
FIG. 4 is a block diagram of an apparatus according to the invention for fabricating a piezoelectric resonator.

FIG. 4 is a block diagram of an apparatus 20 constructed in accordance with the invention. The apparatus includes a vacuum chamber 22 in which is located a pair of spaced-apart electrodes 24 and 26. Electrode 24 serves as an anode. Electrode 26 serves as a cathode. A piezoelectric resonator wafer, which may contain one or more resonator plates 28 (shown in FIGS. 5 and 6), is placed between electrodes 24 and 26 within chamber 22. Materials that may be used for the resonator are generally classed as piezoelectric. Example piezoelectric materials include various crystallographic cuts and orientations of quartz, lithium niobate, lithium tantalate, zinc oxide, aluminum nitride and others. A gas source 30 injects one or more appropriate gases into chamber 22 through a gas flow control 32, which controls the selection, pressure and other aspects of the gas mixture. Power is supplied to the apparatus by a radio frequency (RF) power source such as signal generator 34 whose signal is amplified by a power amplifier 36. The RF source is set to operate at a desired resonant frequency for the piezoelectric resonator and at a desired power level to limit plasma action when the resonator's parallel resonant frequency substantially equals the RF source frequency. The term "RF source," as used herein, includes any alternating signal source of power above 60 Hz and may be constructed in any number of ways to provide the desired frequency and power level. The RF source is operatively connected to electrodes 24 and 26 to form an electrical circuit therewith. As used in this patent, the term "connected" does not require a direct physical connection unless stated specifically. Power from the RF source energizes the gas injected into chamber 22, thereby causing the gas to form a plasma that acts to change the thickness of the resonator 28. The plasma normally exhibits a constant voltage drop from electrode 24 to resonator 28. As will be described, apparatus 20 may be configured for either etching a piezoelectric resonator to reduce its thickness or depositing material on the resonator to increase the resonator thickness.

The electrical connection between RF signal generator 34 and electrodes 24 and 26 is through power amplifier 36 and a matching impedance network 38. Power amplifier 36 amplifies the alternating signal from generator 34 to an appropriate amplitude for operation. Matching network 38 then matches the impedance of the RF source to the impedance of the plasma within chamber 22 so that the maximum amount of power is transferred from the RF source to the plasma. Matching network 38 may also include a current probe for sensing the current in the circuit of apparatus 20, with the current changing as the impedance of the circuit changes. The details of how the matching network work and the sensor is used is described with reference to FIG. 9 below. Other forms of current sensors could, of course, be used.

Also connected to chamber 22 are a vacuum pump 40, gas pressure monitor 42 and viewport 44. Vacuum pump 40 pumps the exhaust plasma and gases out of chamber 22 under the control of pressure monitor 42. Viewport 44 provides a window into chamber 22 to view the action of the plasma as it acts on the piezoelectric resonator 28. From past observations, it is known that as the electrical current that travels from electrode 24 through the plasma to electrode 26 changes, the plasma's location relative to resonator 28 changes. A decrease in current from increasing resonator impedance causes the visible portion of the plasma to move away from the resonator surface. Conversely, an increase in current from decreasing resonator impedance causes the plasma to move toward the resonator surface. This plasma movement phenomenon may be captured through viewport 44 by a an optical sensor 46. The resulting data from sensor 46 is then transmitted to an apparatus control system 48 that controls the frequency or amplitude of the RF source signal generator 34 (and power amplifier 36) in a manner to be described.

Control system 48 may also include a control for adjusting the frequency of signal generator 34 to any of a number of desired resonant frequencies. For example, with this feature an operator can set the signal generator at 25 MHz for manufacturing piezoelectric resonators with this resonant frequency. The operator can then set the generator to 200 MHz for manufacturing other piezoelectric resonators with this second resonant frequency.

Control system 48 also includes a control for setting the power level of the RF source (such as of power amplifier 36) to a value that allows the plasma to extinguish when the resonator's parallel resonant frequency is substantially equal to the RF source frequency.

Figure 5:
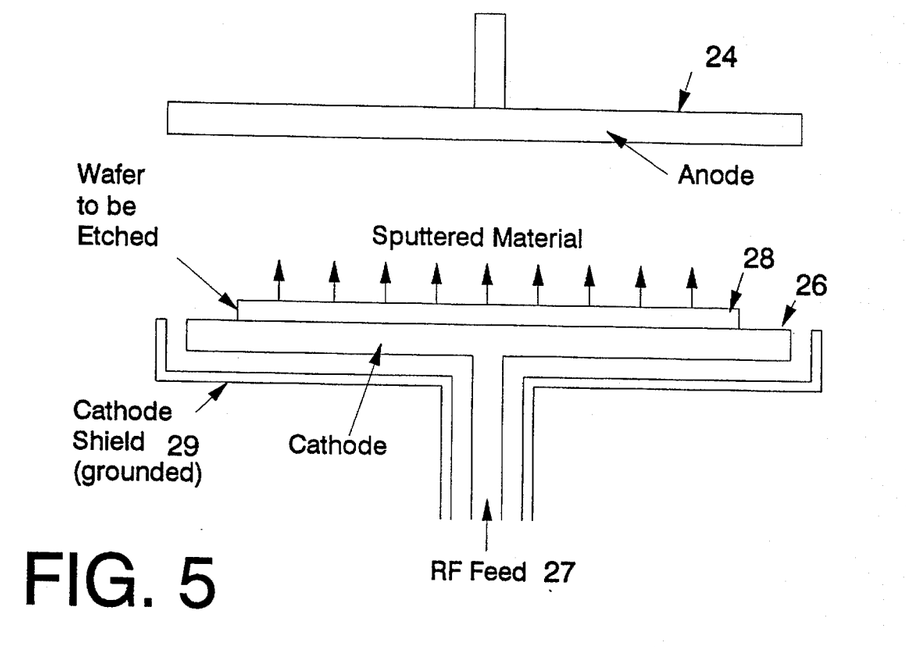
FIG. 5 is a detailed diagram of the apparatus of FIG. 4 configured for etching a piezoelectric resonator by depositing material on the resonator to increase its thickness.

FIG. 5 shows a form of apparatus 20 constructed to plasma etch piezoelectric resonators. The wafer of piezoelectric resonators 28 is mounted on electrode 26, which is operatively connected to the RF source through RF conductor 27 that is surrounded by a cathode shield 29. Positive ions from the plasma within chamber 22 strike the surface of the resonator wafer, removing material from it to reduce the resonator thickness. The sputtered material flux that results is vacuumed from the chamber by pump 40.

Figure 6:
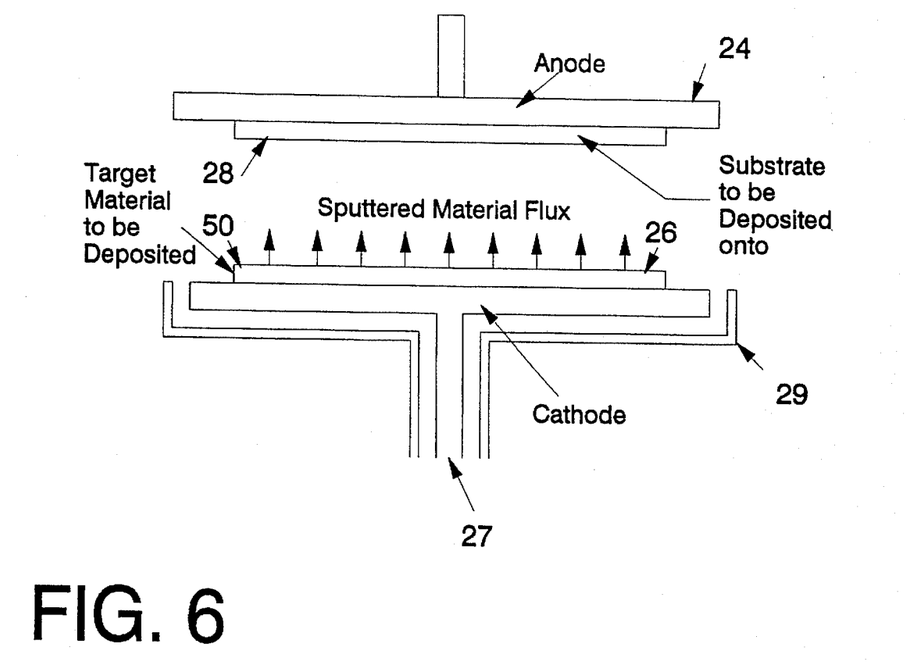
FIG. 6 is a detailed diagram of the apparatus of FIG. 4 configured for depositing material on the resonator to increase its thickness.

FIG. 6 shows a form of apparatus 20 constructed to deposit material on piezoelectric resonators. In this apparatus, a deposition target 50 is mounted to electrode 26 and piezoelectric resonator 28 is mounted to electrode 24. Electrode 26 is operatively connected to the RF source through shielded RF conductor 27. Positive ions from the plasma strike target 50, dislodging material. The material then deposits onto resonator 28 to increase its thickness.

Figure 7:
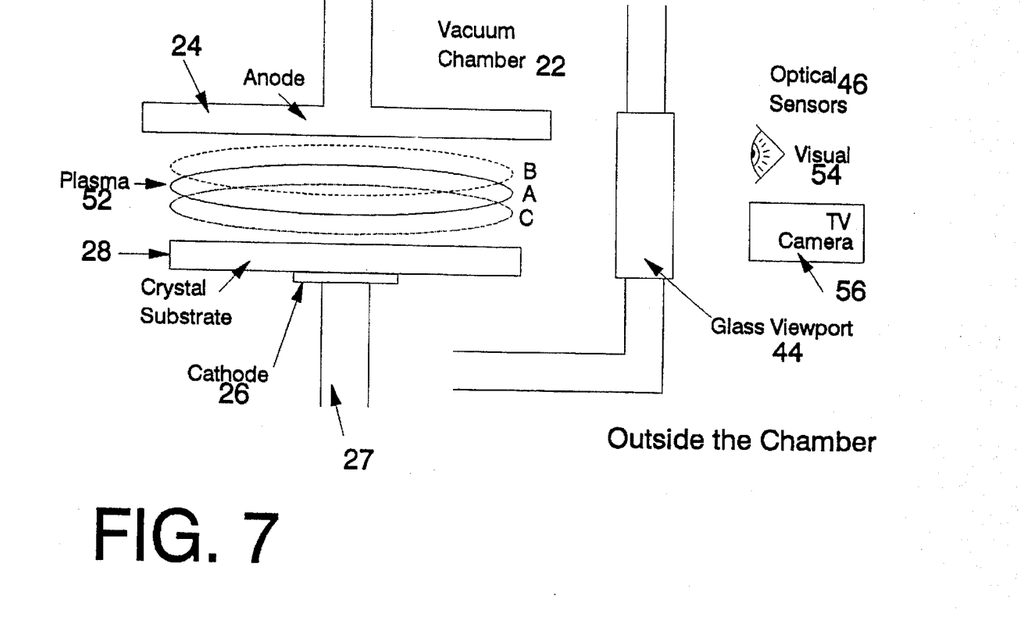
FIG. 7 is a detailed diagram of an optical sensor for use with an apparatus according to the invention.

FIG. 7 is a detailed diagram of one embodiment of the optical sensor 44 of apparatus 20. The optical sensor may be used for observing movement of the plasma which indicates that the changing parallel resonant frequency of piezoelectric resonator 28 now equals the RF source frequency.

While the apparatus is operating, plasma forms a visible cloud 52 that acts to etch piezoelectric resonator 28 in the case of a plasma etcher or sputter a target 50 in the case of a deposition apparatus. In normal etching, plasma cloud 52 is at position A. As the parallel resonant frequency of resonator 28 approaches the RF source frequency, the impedance in the circuit increases, the voltage across the piezoelectric resonator increases, and the current through the apparatus consequently decreases. This current decrease causes cloud 52 to rise from position A toward position B. As series resonance is approached, the circuit impedance decreases and the current increases. The increasing current causes plasma cloud 52 to move from position B and back to A and down to position C. This phenomena can be visually sensed through viewport 44 with a human eye 54 or by inanimate optical sensors such as a TV camera 56. In the case of the human eye, the operator controls signal generator 34 manually. With optical sensors, the process is automated, with the visual signal converted to an electrical signal and transmitted to control system 48.

Optical sensor 46 and control system 48 may be used to shift the RF source frequency as the resonant frequency of the resonator approaches the RF source frequency. This second procedure may be desired in situations where the surface of resonator 28 is initially uneven and as a result the resonator thickness changes at different rates. With an uneven surface the risk is that one area of the resonator will reach the desired resonant frequency well in advance of others. The plasma would then continue to act on all areas, possible causing the one area to pass the desired parallel resonant frequency while other areas are catching up. This can be seen in FIGS. 2 and 3, where the rate of frequency change eventually increases. If that happens, the resonator impedance for the one area will decrease rapidly and its parallel resonant frequency will shift away from the desired frequency.

Figure 8:
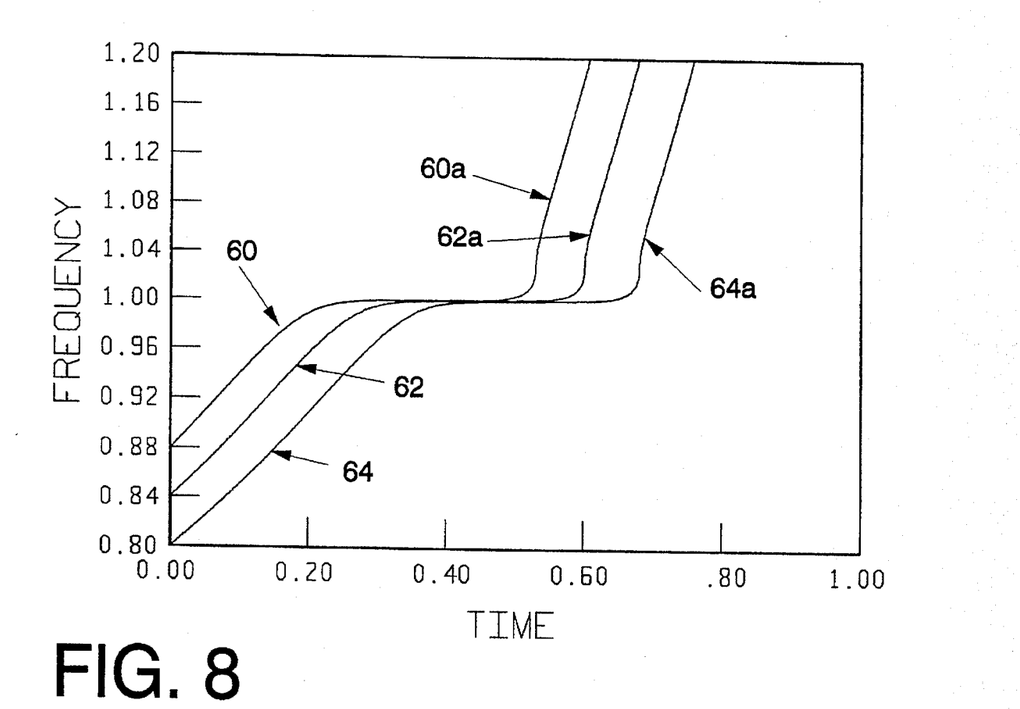
FIG. 8 is a graph of the etching characteristics of a piezoelectric resonator as a function of time, with the RF source frequency changing.

By using control system 48 to adjust the initial frequency of signal generator 34 to shift as the resonator's resonant frequency approaches the initial RF source frequency, this risk can be minimized. FIG. 8 shows how this may be done in the context of etching. Curve 60 shows the initial frequency-time relationship. As the reduced etching rate of the thinner areas approaches time point 60a, control system 48 shifts the RF source frequency upward to a second frequency. The resulting frequency-time relationship is shown by curve 62. This extends the reduced etching rate further in time to point 62a, allowing other area to "catch up" as the area at parallel resonant frequency remain there. Control system 48 can be programmed to further shift the RF source frequency if needed to additional frequencies, represented by frequency-time line 64. This extends the slow etch rate to point 64a. Control system 48 can effectively monitor the etch rates through optical sensor 46 and this can change the RF source frequency at the appropriate time, before it increases.

Figure 9:
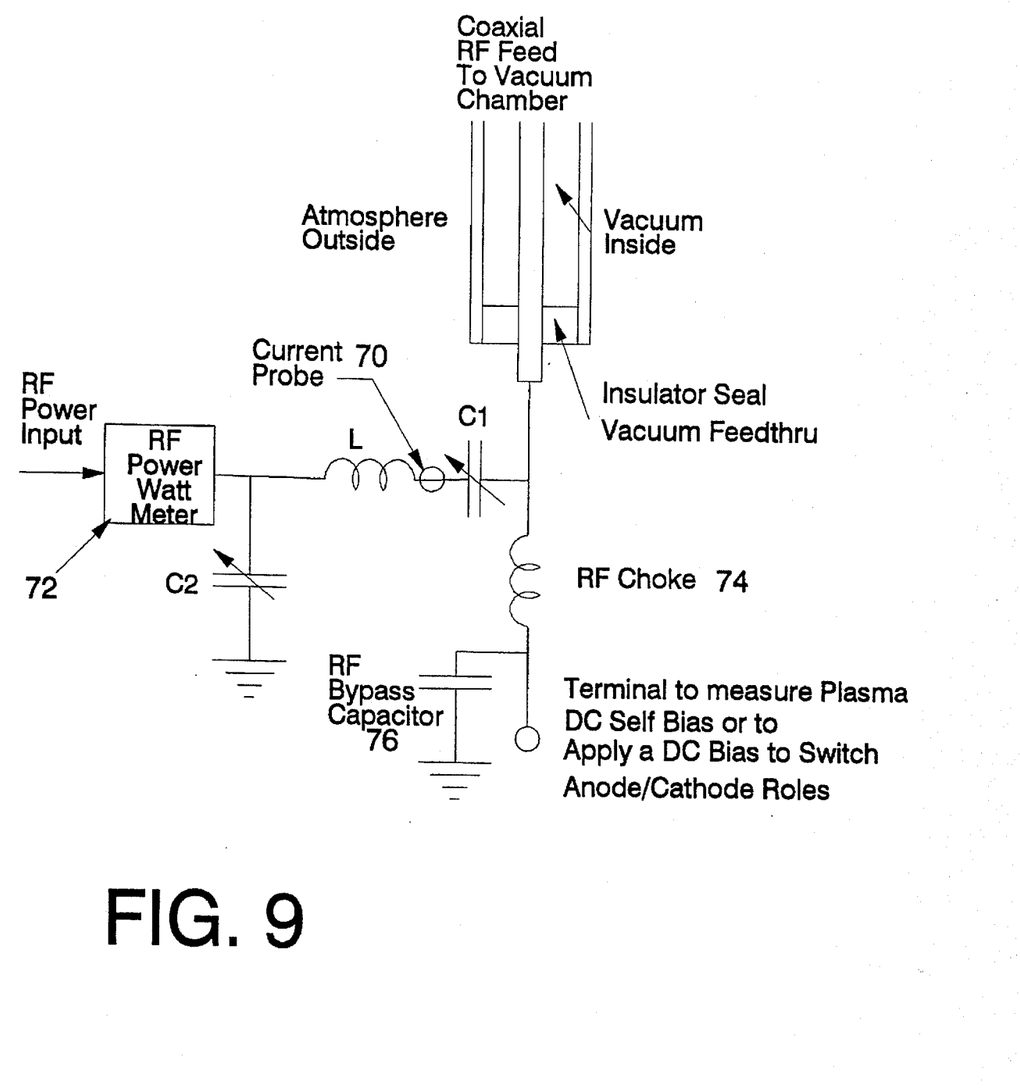
FIG. 9 is a detailed diagram of an impedance matching network including a current sensor for use in an apparatus according to the invention.

Another technique for sensing the approach of resonator 28 to the RF source frequency is shown in FIG. 9. FIG. 9 is a detailed diagram of impedance matching network 38. Within network 38 is a current sensor 70 in the form of a probe sensor for sensing the electrical current through the circuit in apparatus 20. Control system 48 is responsive to sensor 70 in the same manner it responds to optical sensor 46.

For lower frequency operation, matching network 38 includes an RF power meter 72, inductor L1, RF choke 74, bypass capacitor 76 and variable capacitors C1 and C2. Power meter 72-measures forward and reflected power. Variable capacitors C1 and C2 are adjusted to minimize the reflected power as measured by power meter 72 and this maximize the power transferred from the RF source to the plasma within chamber 22. This capacitive adjustment matches the impedance of the plasma to the power amplifier. Capacitors C1 and C2 may be adjusted manually or automatically, depending on design choice.

Figure 10:
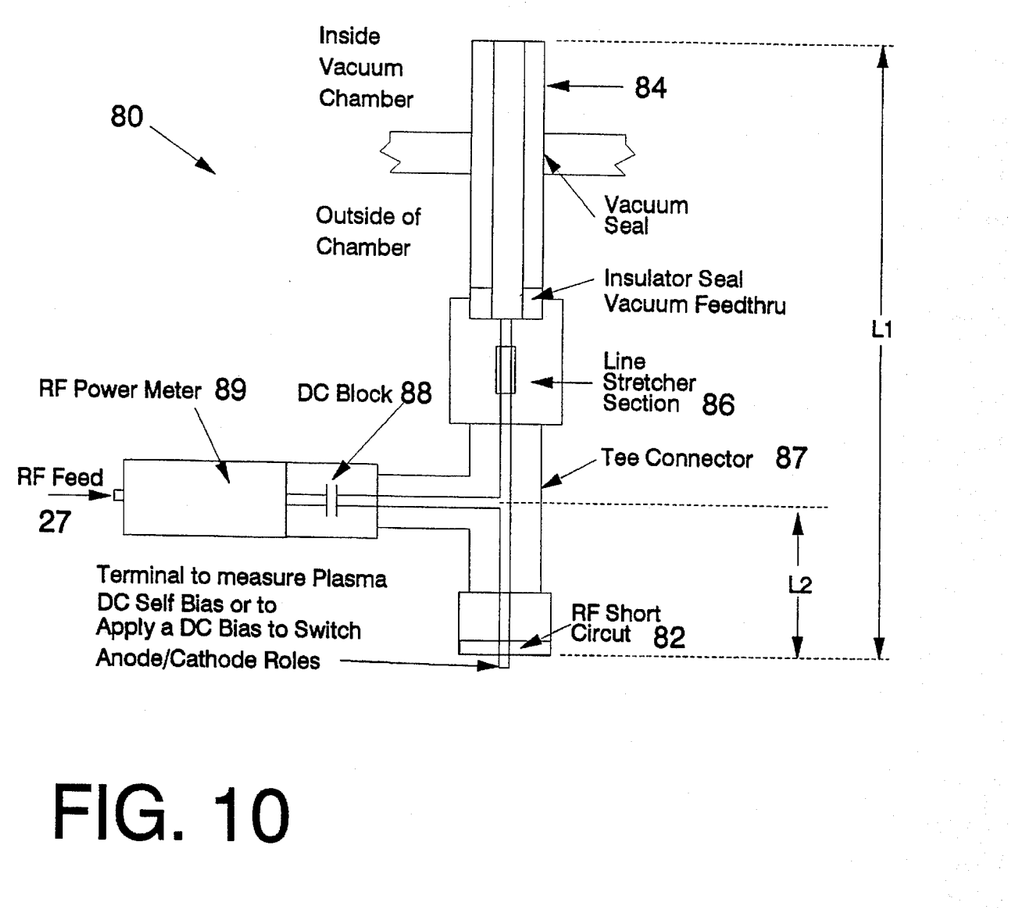
FIG. 10 is a detailed diagram of another embodiment of an impedance matching network for use in an apparatus according to the invention.

For higher frequency operation such as in the very high frequency (VHF) and ultra high frequency (UHF) bands, the matching network design of FIG. 9 is not practical. The size of capacitors C1, C2 and the other components described above become too small to construct. A novel alternative matching network is shown in FIG. 10. The high impedance of the small area cathode 26 and plasma are transformed through a quarter wavelength section of coaxial transmission line 84. The length L1 of line 84 may be any odd multiple of a quarter wavelength and still constitute a resonator for impedance matching purposes. The low impedance end of quarter wave coaxial line 84 is defined by an RF short circuit 82 such as a capacitor or another section of coaxial line. A tap 87 positioned along the coaxial line such as a coaxial TEE connector allows the RF signal to be effectively tapped onto line 84 a distance L2 from the RF grounded end. The position of tap 87 along line 84 determines the impedance transformation level. A line stretcher 86 may be added to the coaxial line to allow for adjustment of length so that L1 corresponds to a resonant length at the desired frequency. Tap 87 connects to the RF source through a DC block 88 and RF conductor 27. RF short circuit 82 allows the plasma to establish a DC self bias. A power meter 89 is provided for sensing forward and reflected power through the resonator 80.

Operation

A generalized method according to the invention for adjusting the resonant frequency of a piezoelectric resonator by changing its thickness includes the following steps. A resonator wafer 28 is placed between a pair of electrodes such as electrodes 24 and 26 in vacuum chamber 22. An RF source such as signal generator 34 generates a signal at the desired resonant frequency, which signal is amplified and applied to one of the electrodes. The appropriate gases are injected between the electrodes. Power is applied from the RF source to the electrodes to energize the gas to form a plasma that acts to change the thickness of the piezoelectric resonator. The resonator provides an impedance which changes as the plasma action changes the thickness of the resonator and thereby changes the resonant frequency of the resonator. As the resonant frequency of the resonator approaches the frequency of the RF source, the impedance of the resonator increases dramatically, slowing the rate of plasma action. The plasma action substantially stops with the resonant frequency of the piezoelectric resonator substantially equal to the RF source frequency.

Figure 11:
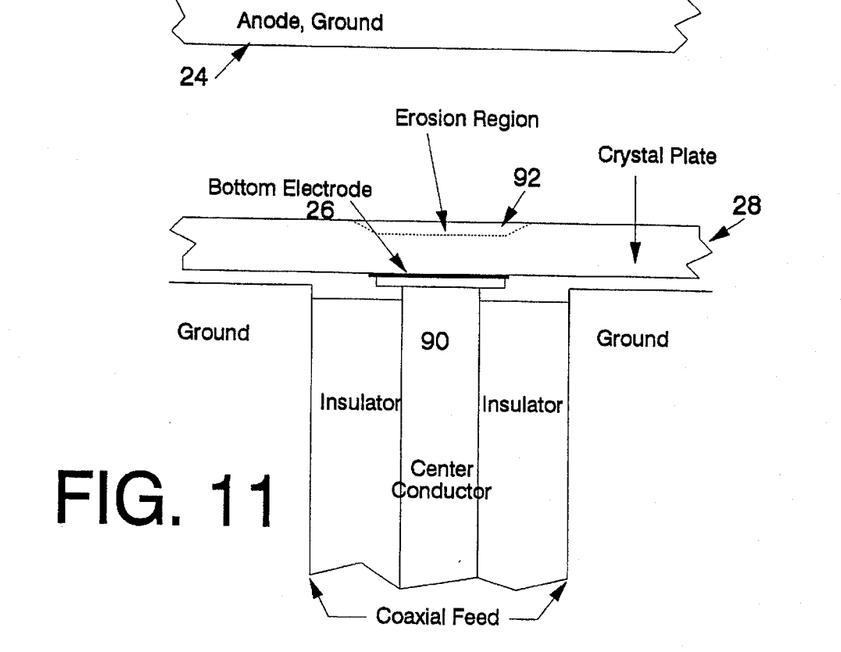
FIG. 11 is a detailed diagram of one embodiment of a method for etching a piezoelectric resonator according to the invention.
Figure 12:
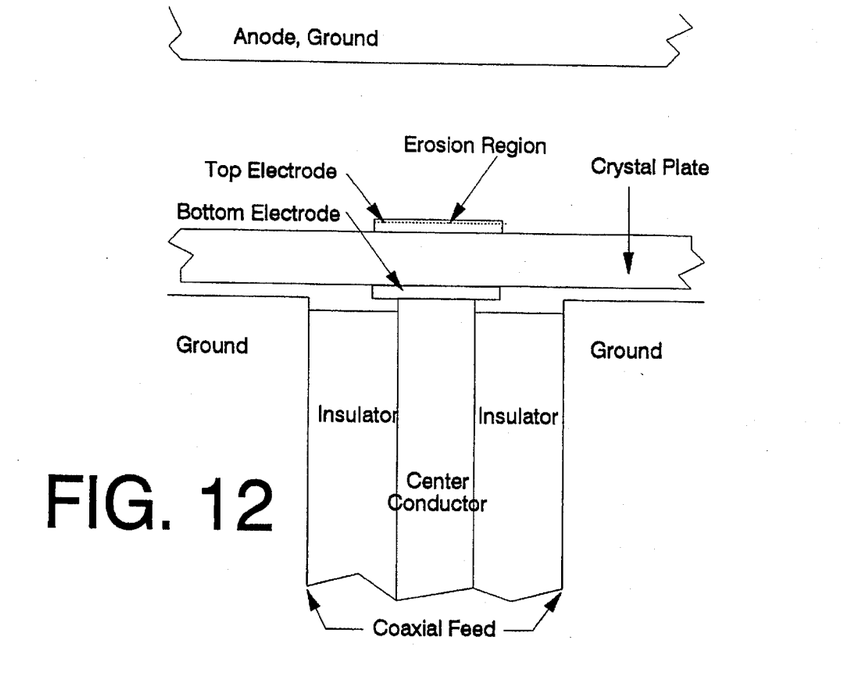
FIG. 12 is a detailed diagram of another embodiment of a method for etching a piezoelectric resonator according to the invention.
Figure 13:
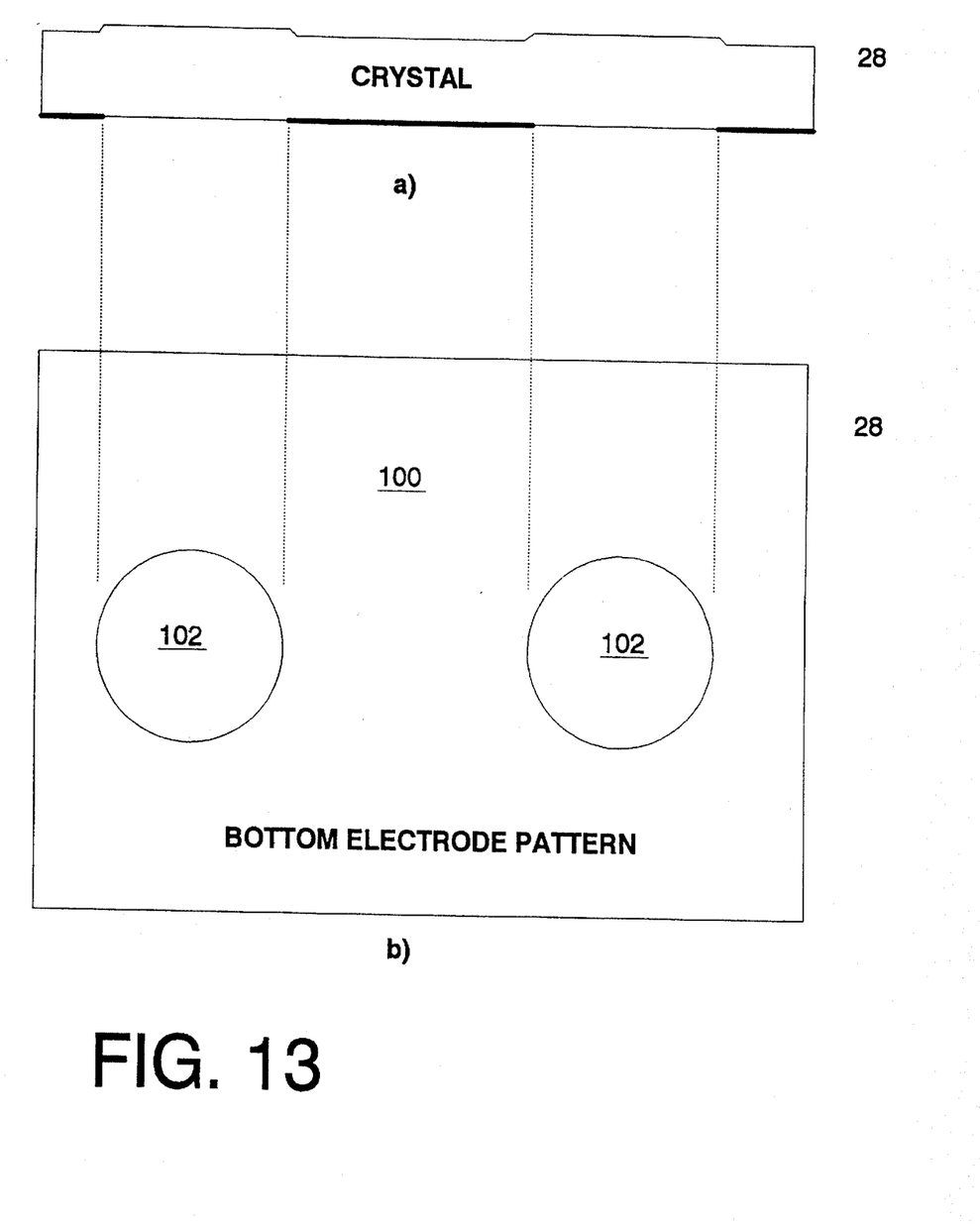
FIG. 13 is a detailed diagram of still another embodiment of a method for etching a piezoelectric resonator according to the invention.

FIG. 11 is a detailed diagram of one embodiment of a method for etching a piezoelectric resonator 28. Electrically connected to electrode 26 is a center conductor 90 of RF conductor 27. Anode electrode 24 is at ground potential. Cathode electrode 26 is at a negative voltage with respect to ground. In this embodiment, electrode 26 is actually bound to resonator plate 28 and is removably mounted to conductor 90 such that acoustic waves generated in the resonator are not substantially coupled to conductor 90. This may be achieved through light mechanical contact or close proximity high capacitance contact. Because of the area difference between electrodes 26 and 24, a DC voltage drop develops from electrode 24 to electrode 26 such that the smaller area, electrode 26, develops a negative voltage. The resulting electric field from this voltage provides a force that accelerates positive ions towards electrode 26 that are intercepted at the upper surface of resonator 28, etching a shallow region 92 above the electrode 26. An electrode may then be mounted on region 92 to form a second electrode of the resonator. If electrode 26 were the same area as electrode 24, then a DC bias would be provided externally, and the positive ions would etch the entire surface of resonator 28.

Another option for fabrication is trimming composite resonators of more complex detail whose surfaces produce voltages and impedances that alter the plasma current at resonance.

Having illustrated and described the principles of the invention in a preferred embodiment, it should be apparent to those skilled in the art that the embodiment can be modified in arrangement and detail without departing from such principles. In view of the many possible embodiments to which the principles of my invention may be applied, it should be recognized that the illustrated embodiment is only a preferred example of the invention and should not be taken as a limitation on the scope of the invention. Rather, the invention is defined by the following claims. I therefore claim as my invention all that comes within the scope and spirit of these claims.

I claim:

1. An apparatus for adjusting the resonant frequency of a piezoelectric resonator by changing the thickness of the resonator, comprising:

a pair of electrodes between which a piezoelectric resonator is placed;

an RF source operable at a desired resonant frequency for the piezoelectric resonator and at a desired power level, the RF source operatively connected to the electrodes to form a circuit therewith; and a gas source for injecting gas between the electrodes, the RF source energizing the gas to form a plasma that acts to change the thickness of the piezoelectric resonator;

the resonator providing an impedance in the circuit which changes as the plasma action changes the thickness of the resonator and thereby changes the resonant frequency of the piezoelectric resonator, the changing impedance changing the rate of plasma action until, with the RF source set at the desired power level, the action substantially stops with the resonant frequency of the piezoelectric resonator substantially equal to the frequency of the RF source.

2. The apparatus of claim 1 wherein the plasma etches material from the piezoelectric resonator to reduce its thickness.

3. The apparatus of claim 1 wherein the plasma strikes a target, dislodging target material that is deposited on the piezoelectric resonator to increase its thickness.

4. The apparatus of claim 1 including a control for adjusting the frequency of the RF source to a desired resonant frequency.

5. The apparatus of claim 4 wherein the frequency of the RF source is an initial frequency and the control is adapted to shift the RF source frequency from the initial frequency to a second frequency as the resonant frequency of the resonator approaches the initial frequency of the RF source.

6. The apparatus of claim 4 including a sensor for detecting the proximity of the plasma to the resonator, the control responsive to the sensor to change the RF source frequency as the plasma moves toward or away from the resonator.

7. The apparatus of claim 4 including a sensor for sensing current in the circuit, the control responsive to the sensor to change the RF source as the current in the circuit changes.

8. The apparatus of claim 1 wherein the frequency of the RF source is at least 25 MHz.

9. The apparatus of claim 1 including a matching network for matching an impedance of an RF source to the impedance of the plasma.

10. The apparatus of claim 1 including;

a length of coaxial line connected at one end to an electrode;

an RF short circuit connected to another end of the coaxial line; and a tap connected to the RF source and positioned along the coaxial line.

11. The apparatus of claim 1 wherein the frequency of the RF source is variable and the apparatus includes an impedance matching network with a variable impedance to match an impedance of the variable RF source to the impedance of the plasma.

12. The apparatus of claim 4 including a control to set the power level of the RF source to a value that allows the plasma to extinguish when the resonator's parallel resonant frequency substantially equals the RF source frequency.

13. A method for adjusting the resonant frequency of a piezoelectric resonator by changing the thickness of the resonator, comprising:

placing a piezoelectric resonator between a pair of electrodes;

injecting a gas between the electrodes; and applying power from an RF source operating at a desired resonant frequency for the piezoelectric resonator and at a desired power level to the electrodes to energize the gas to form a plasma that acts to change the thickness of the piezoelectric resonator, the resonator providing an impedance which changes as the plasma action changes the thickness of the resonator and thereby changes the resonant frequency of the piezoelectric resonator, the changing impedance changing the rate of plasma action until, with the RF source set at the desired power level, the action substantially stops with the resonant frequency of the piezoelectric resonator substantially equal to the frequency of the RF source.

14. The method of claim 13 wherein power from the RF source is applied to the electrodes to energize a gas to form a plasma for etching material from the piezoelectric resonator to reduce its thickness.

15. The method of claim 13 wherein power from the RF source is applied to the electrodes to energize a gas to form a plasma that strikes a target, dislodging target material that is deposited on the piezoelectric resonator to increase its thickness.

16. The method of claim 13 wherein the RF source has a variable frequency, and the method includes adjusting the frequency of the RF source from an initial frequency to a second frequency as the resonant frequency of the resonator approaches the initial frequency.

17. The method of claim 16 including matching an impedance of the RF source to an impedance of the plasma by adjusting the impedance of an adjustable matching impedance network.

18. The method of claim 13 wherein the RF source has a variable frequency, the method including detecting the proximity of the plasma to the resonator and shifting the frequency of the RF source as the plasma moves away from the resonator.

19. The method of claim 13 including sensing current through the electrodes, the current changing as the impedance of the resonator changes; and shutting off the RF source if the sensed current indicates resonance of the resonator.

20. The method of claim 13 including inserting an electrode onto the resonator between the plasma and the resonator.

21. The method of claim 13 including coating a region of a side of the resonator with a material to reduce the resonant frequency of the resonator in the coated region.

22. A method for adjusting the resonant frequency of a piezoelectric resonator by changing the thickness of the resonator, comprising:

placing a piezoelectric resonator between a pair of electrodes; operatively connecting an RF source to the electrodes;

injecting a gas between the electrodes to form a plasma;

setting the RF source to a desired resonant frequency for the piezoelectric resonator;

setting power of the RF source to a level such that the plasma extinguishes when the piezoelectric resonator's resonant frequency substantially equals the RF source frequency; and applying the power of the RF source at the desired resonant frequency to the electrodes to energize the gas to form the plasma, the plasma acting to change the thickness of the piezoelectric resonator until the resonator reaches the desired resonant frequency provided by the RF source.

* * * * *